US009260297B2

(12) United States Patent
Jiao et al.

(10) Patent No.: US 9,260,297 B2
(45) Date of Patent: Feb. 16, 2016

(54) CANTILEVER BEAM STRUCTURE WHERE STRESS IS MATCHED AND METHOD OF MANUFACTURING THE SAME

(71) Applicant: Institute of Microelectronics, Chinese Academy of Sciences, Beijing (CN)

(72) Inventors: Binbin Jiao, Beijing (CN); Ruiwen Liu, Beijing (CN); Zhigang Li, Beijing (CN); Yanmei Kong, Beijing (CN); Dapeng Chen, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 90 days.

(21) Appl. No.: 14/110,812

(22) PCT Filed: Jul. 17, 2013

(86) PCT No.: PCT/CN2013/079515
§ 371 (c)(1),
(2) Date: Oct. 9, 2013

(87) PCT Pub. No.: WO2014/201745
PCT Pub. Date: Dec. 24, 2014

(65) Prior Publication Data
US 2014/0374857 A1 Dec. 25, 2014

(30) Foreign Application Priority Data
Jun. 21, 2013 (CN) .......................... 2013 1 0249847

(51) Int. Cl.
*B81C 1/00* (2006.01)
*B81B 3/00* (2006.01)
(52) U.S. Cl.
CPC ............. *B81C 1/0015* (2013.01); *B81B 3/0018* (2013.01); *B81B 3/0051* (2013.01); *B81B 3/0072* (2013.01); *B81B 2203/0118* (2013.01)

(58) Field of Classification Search
None
See application file for complete search history.

(56) References Cited

U.S. PATENT DOCUMENTS

| 7,763,947 B2 | 7/2010 | Zhan et al. |
| 7,875,483 B2 | 1/2011 | Izumi et al. |
| 2011/0233693 A1* | 9/2011 | Perruchot et al. ............. 257/417 |

FOREIGN PATENT DOCUMENTS

| CN | 100506686 C | 5/2007 |
| CN | 100562484 C | 11/2007 |

(Continued)

OTHER PUBLICATIONS

International Search Report and Written Opinion for PCT Application No. PCT/CN2013/079515, dated Mar. 13, 2014, 7 pages.

*Primary Examiner* — Bilkis Jahan
*Assistant Examiner* — Kevin Quinto
(74) *Attorney, Agent, or Firm* — Westman, Champlin & Koehler, P.A.

(57) ABSTRACT

A cantilever beam structure where stress is matched and a method of manufacturing the same are provided. An example method may comprise depositing a first sub-layer of a first material with a first deposition menu and depositing a second sub-layer of the first material with a second deposition menu different from the first deposition menu. The first sub-layer and the second sub-layer can be disposed adjacent to each other to form a first layer. The method may further comprise depositing a second layer of a second material different from the first material. The first layer and the second layer can be disposed adjacent to each other. The method may further comprise matching stress between the first layer and the second layer by adjusting at least one of thicknesses of the respective sub-layers of the first layer and a thickness of the second layer.

11 Claims, 3 Drawing Sheets

(56) References Cited

FOREIGN PATENT DOCUMENTS

| | | |
|---|---|---|
| CN | 101439842 A | 5/2009 |
| CN | 101439842 A | 5/2009 |
| CN | 102139855 A | 8/2011 |
| JP | 2011140072 A | 7/2011 |

* cited by examiner

CANTILEVER BEAM STRUCTURE WHERE STRESS IS MATCHED AND METHOD OF MANUFACTURING THE SAME

CROSS-REFERENCE TO RELATED APPLICATION(S)

This application claims priority to Chinese Application No. 201310249847.9, filed on Jun. 21, 2013, entitled "CANTILEVER BEAM STRUCTURE WHERE STRESS IS MATCHED AND METHOD OF MANUFACTURING THE SAME," which is incorporated herein by reference in its entirety.

TECHNICAL FIELD

The present disclosure generally relates to the field of micromachining, and more particularly, to a cantilever beam structure where stress is matched and a method of manufacturing the same.

BACKGROUND

With development of the Micro-Electro-Mechanical System (MEMS) technology, bi-material microcantilever beam structures are finding more and more applications, such as biosensors, arrays of micro-mirrors, capacitive infrared detectors, thermo-mechanical infrared detectors, and the like. These applications are based on a principle that a physical factor to be sensed is applied to the bi-material cantilever beam structure to cause deformation thereof. The deformation has a magnitude reflecting a strength of the factor to be sensed, and thus can be detected electrically or optically so as to read out the factor to be sensed.

However, practically manufacture processes tend to cause residual stress in the bi-material cantilever beam structure, the bi-material cantilever beam structure suffers an initial deformation after being released due to the mismatch of residual stress in two material films. Thus, a resultant device will have a decreased sensitivity or even fail. Therefore, in order for the device to function effectively, it is desirable to adjust the residual stress in the two material films to achieve stress matching.

There are mainly four types of techniques to adjust the film stress as reported. A first one is to adjust particular process parameter(s) in a film deposition apparatus for film stress adjustment, so as to achieve stress matching between the two material films. This method is applicable to the stress adjustment in various films, but it is complicated to operate and is time-consuming to develop because there are so many process parameters. A second one is to perform ion implantation and annealing in a deposited film for stress adjustment in the film. However, this method usually needs to perform the ion implantation with a high energy at a high dose to achieve stress matching, which may destroy a lattice structure of the film. Further, implanted ions may cause variations of original characteristics of the film. Such disadvantages limit applications of the method. Also, the incorporated additional processes caused an increased development cost and cycle. A third one is to introduce a stress gradient in a film by varying process parameters in depositing the film so as to achieve stress matching with a different film. This method is widely applicable. However, it is complicated to operate and is time-consuming to develop because there are so many process parameters. A fourth one is to release stress from a double-material beam by thermal cycling for stress adjustment. This method incorporates an additional process, resulting in an increased development cycle. Also, the thermal cycling generally means a high temperature, and thus limits applications of the method in some devices with temperature sensitive structures.

In view of the above, the existing techniques for matching the stress in the double-material film are not good enough to meet current trends of fables design and manufacture of MEMS devices.

SUMMARY

The present disclosure aims to provide, among others, a cantilever beam structure where stress is matched and a method of manufacturing the same, by which it is possible to match stress between/among respective material layers of the cantilever beam structure in a simple way.

According to an aspect of the present disclosure, there is provided a method of manufacturing a cantilever beam structure where stress is matched, comprising: depositing a first sub-layer of a first material with a first deposition menu; depositing a second sub-layer of the first material with a second deposition menu different from the first deposition menu, wherein the first sub-layer and the second sub-layer are disposed adjacent to each other to form a first layer; and depositing a second layer of a second material different from the first material, wherein the first layer and the second layer are disposed adjacent to each other, wherein the method further comprises matching stress between the first layer and the second layer by adjusting at least one of thicknesses of the respective sub-layers of the first layer and a thickness of the second layer.

According to a further aspect of the present disclosure, there is provided a cantilever beam structure where stress is matched, comprising: a substrate; a beam configuration formed on the substrate with one end thereof suspended with respect to the substrate so as to form the cantilever beam structure, wherein the beam configuration comprises a stack of a first layer of a first material and a second layer of a second material, the first layer including a first sub-layer and a second sub-layer formed with different deposition menus, and wherein at least one of thicknesses of the respective sub-layers of the first layer and a thickness of the second layer is set to match stress between the first layer and the second layer.

According to embodiments of the present disclosure, a film of one same material can be deposited by means of two or more deposition menus, and thus a stepped stress gradient can be introduced in the film. It is possible to match stress between this film and a further film of a different material by adjusting a thickness of at least one of the film layers. This stress matching scheme is simple but effective, and can be performed with deposition menus which have already been developed, i.e., with existing apparatuses and process conditions. Further, stress matching between the material layers can be achieved only by control of the thicknesses of the film layers deposited with the deposition menus, with no needs to perform complicated adjustments of film deposition parameters. Therefore, this stress matching scheme is very suitable for interfacing in processes between MEMS manufacturers and designers.

BRIEF DESCRIPTION OF THE DRAWINGS

The above and other objects, features, and advantages of the present disclosure will become more apparent from following descriptions on embodiments thereof with reference to attached drawings, in which.

DETAILED DESCRIPTION

Hereinafter, descriptions are given with reference to embodiments shown in the attached drawings. However, it is to be understood that these descriptions are illustrative and not intended to limit the present disclosure. Further, in the following, known structures and technologies are not described to avoid obscuring the present disclosure unnecessarily.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances and technique limitations in practice. Those skilled in the art can also devise regions/layers of other different shapes, sizes, and relative positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

According to embodiments of the present disclosure, there is provided a bi-material or multi-material cantilever beam consisted of two or more material layers. For example, the cantilever beam may comprise a first material layer and a second material layer (or optionally, more material layer(s)) disposed adjacent to each other. The beam can be disposed on a substrate, with one end thereof suspended with respect to the substrate, to form a cantilever beam structure. To match stress between the first material layer and the second material layer disposed adjacent to each other, at least one of the first material layer and the second material layer (here, the first material layer, for example) may comprise two or more sub-layers stacked on each other. Each of the sub-layers may have different stress therein, so that there can be a stepped stress gradient formed in the first material layer. As a result, it is possible to match the stress between/among the respective material layers of the cantilever beam by adjusting a thickness of any one or more of the film layers.

According to an embodiment of the present disclosure, the sub-layers can be deposited by different deposition menus, respectively, and thus each may have different stress induced therein. Here, so called "deposition menu" may refer to a combination of a given deposition process and process parameters developed for this deposition process. For example, the deposition process comprises any one or more of evaporation, sputtering, Plasma Enhanced Chemical Vapor Deposition (PECVD), Low Pressure Chemical Vapor Deposition (LPCVD), Atmospheric Pressure Chemical Vapor Deposition (APCVD), High Density Plasma Chemical Vapor Deposition (HDPCVD), Atom Layer Deposition (ALD), and Metal Organic Chemical Vapor Deposition (MOCVD). For example, such a deposition menu is a standard option developed by a manufacturer based on its apparatuses and process conditions. Thus, a designer can choose a particular deposition menu and determine, the thicknesses of the respective layers, while the manufacturer only needs to utilize its existing apparatuses and process conditions to work based on a design scheme provided by the designer, without need to develop new apparatuses or adjust the process conditions.

The technology of the present disclosure can be implemented in various ways, some of which are exemplified in the following with reference to the drawings.

Figure 1:
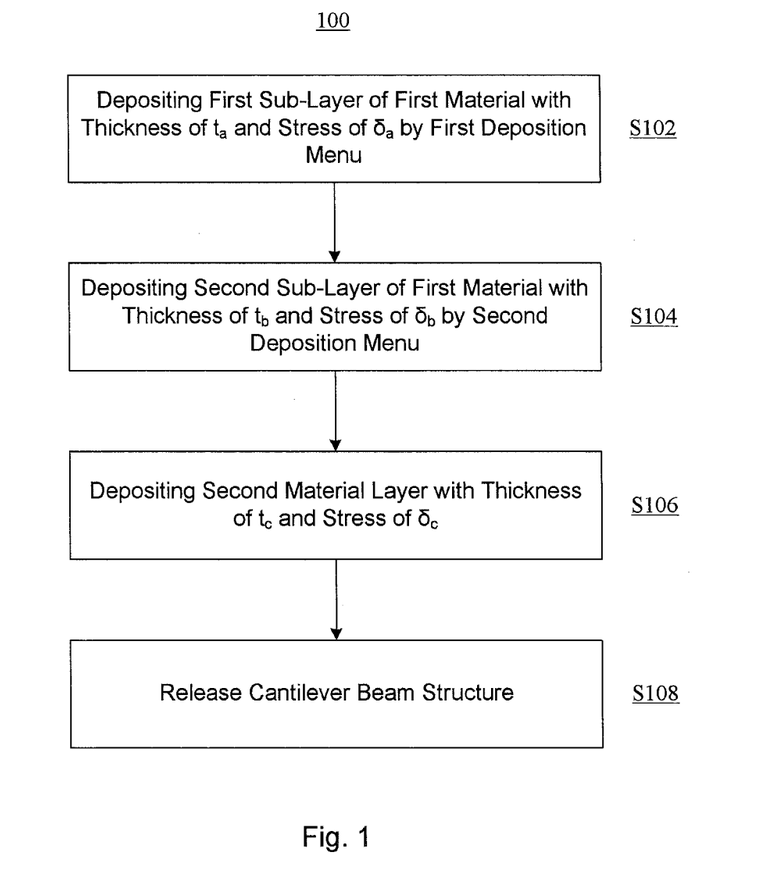
FIG. 1 is a flow chart schematically showing a method of manufacturing a cantilever beam structure according to an embodiment of the present disclosure.

FIG. 1 is a flow chart schematically showing a method of manufacturing a cantilever beam structure according to an embodiment of the present disclosure. As shown in FIG. 1, the method 100 may comprise depositing a first sub-layer of a first material, with a thickness of $t_a$ and stress of $\delta_a$, by means of a first deposition menu at an operation S102. The first deposition menu may comprise any one or more of evaporation, sputtering, PECVD, LPCVD, APCVD, HDPCVD, ALD, and MOCVD, and corresponding process parameters, as described above. The deposition menu substantially determines the stress $\delta_a$ induced in the first sub-layer. The first material may comprise a non-metal material, such as any one or more of silicon oxide, silicon nitride, silicon oxynitride, poly-silicon, amorphous silicon, glass, C, Ge, SiC, USG, polyimide, BCB, photoresist, and other non-metal materials available in micromachining, or a metal material, such as any one or more of Al, Au, Ti, Cr, Ag, Pt, Ni, Zn, Pb, W, Cu, Sn, In, Ga, an oxide or alloy thereof, and other materials suitable for micromachining.

Figure 2:
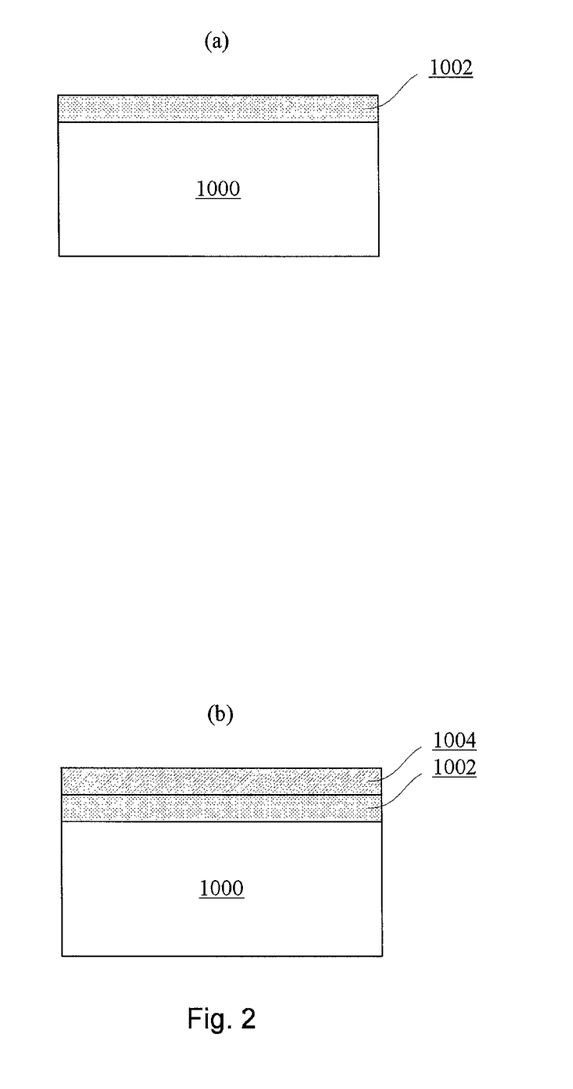
FIGS. 2(a)-(d) are sectional views schematically showing some stages in a flow of manufacturing a cantilever beam structure according to an embodiment of the present disclosure.

FIG. 2(a) shows an example where a first sub-layer 1002 is deposited on a substrate 1000. The substrate 1000 may comprise a semiconductor material, such as Si, Ge, or the like. The first sub-layer 1002 may be configured as described above. In the example of FIG. 2(a), the first sub-layer 1002 is shown as being disposed directly on the substrate 1000. However, the present disclosure is not limited thereto. For example, the substrate 1000 may have a sacrificial layer (not shown) provided thereon, on which the first sub-layer 1002 is disposed. Alternatively, the first sub-layer 1002 may be an intermediate layer of a double/multi-material cantilever beam structure, and thus is separated from the substrate 1000.

Turning back to FIG. 1, the method 100 may further comprise depositing a second sub-layer of the first material, with a thickness of $t_b$ and stress of $\delta_b$, by means of a second deposition menu different from the first deposition menu at an operation S104. The second deposition menu may comprise any one or more of evaporation, sputtering, PECVD, LPCVD, APCVD, HDPCVD, ALD, and MOCVD, and corresponding process parameters, as described above. The deposition menu substantially determines the stress $\delta_b$ induced in the second sub-layer. The second deposition menu may differ from the first deposition menu in that it has a different deposition process from the first deposition menu, and/or that it has different process parameter(s) from the first deposition menu, especially if it has the same deposition process as the first deposition menu. It is to be noted that in the latter case the "different process parameter(s)" do not mean that the process parameter(s) need to be adjusted as in the prior art where the process parameter(s) is/are adjusted to achieve stress matching. Here, the stress matching does not rely upon adjustment of the process parameters, but instead upon adjustment of the film thickness, as will be described later. The "different" process parameters are caused due to the different deposition menus, and thus can be easily achieved by replacing a working deposition menu, without need to be adjusted in a complicated way for the purpose of stress matching as in the prior art.

FIG. 2(b) shows an example where a second sub-layer 1004 is deposited on the first sub-layer 1002. As shown in FIG. 2(b), the first sub-layer 1002 and the second sub-layer 1004 are disposed adjacent to each other, and thus form a first layer of the first material. In the example of FIG. 2(b), the first material layer is shown as a stack of the first sub-layer 1002 and the second sub-layer 1004. However, the present disclosure is not limited thereto. For example, more sub-layer(s) of the first material can be further formed on the second sub-layer 1004 by further deposition menu(s).

Turning back to FIG. 1, the method 100 may further comprise depositing a layer of a second material different from the first material, with a thickness of $t_c$ and stress of $\delta_c$, at an operation S106. The second material layer can be deposited by means of one or more deposition menus, for example, any one or more of evaporation, sputtering, PECVD, LPCVD, APCVD, HDPCVD, ALD, and MOCVD. The deposition menu for the second material layer can be same as or different from the deposition menu for the first sub-layer and/or the deposition menu for the second sub-layer. The deposition menu substantially determines the stress $\delta_c$ induced in the second material layer. Likewise, The second material may comprise a non-metal material, such as any one or more of silicon oxide, silicon nitride, silicon oxynitride, poly-silicon, amorphous silicon, glass, C, Ge, SiC, USG, polyimide, BCB, photoresist, and other non-metal materials available in micromachining, or a metal material, such as any one or more of Al, Au, Ti, Cr, Ag, Pt, Ni, Zn, Pb, W, Cu, Sn, In, Ga, an oxide or alloy thereof, and other materials suitable for micromachining.

FIG. 2(c) shows an example where a second material layer 1006 is deposited on the second sub-layer 1004. As shown in FIG. 2(c), the first material layer (including the first sub-layer 1002 and the second sub-layer 1004) and the second material layer 1006 are disposed adjacent to each other. In the example of FIG. 2(c), the second material layer is shown in a single layer configuration. However, the present disclosure is not limited thereto. For example, the second material layer 1006 may comprise two or more sub-layers deposited by means of different deposition menus.

Further, in the example of FIG. 2(c), the cantilever beam is shown as having a film configuration including the first material layer and the second material layer. However, the present disclosure is not limited thereto. For example, on the second material layer 106 one or more material layers may be further formed, some or all of which each may comprise two or more sub-layers deposited by different deposition menus.

Turning back to FIG. 1, the method 100 may further comprise patterning the film layers formed as described above to form a beam configuration, and selectively etching the substrate or the sacrificial layer to release the beam configuration so as to form a cantilever beam structure at an operation S108. The patterning can be done by photolithography and then etching such as Reactive Ion Etching (RIE).

FIG. 2(d) shows an example where a groove G is formed by selectively etching the substrate 1000 or selectively etching the sacrificial layer, so that the beam configuration (including the first material layer and the second material layer) has one end thereof suspended with respect to the substrate and thus forms a cantilever beam structure.

Although the operations S102, S104, S106, and S108 are sequentially described in the above, they need not to be carried out in this sequence. For example, it is possible that the second material layer is formed before the first material layer is formed, and also it is possible that in the first material layer the second sub-layer is formed before the first sub-layer.

According to an advantageous example of the present disclosure, stress matching between the first material layer and the second material layer can be achieved by adjusting at least one of the thicknesses $t_a$, $t_b$, and $t_c$ of the respective film layers. For example, the stress matching may be achieved by satisfying the following equation:

$$E_a t_a \delta_b t_b^2 + E_a t_a \delta_c t_c^2 + E_b t_b \delta_c t_c^2 + E_a t_a^2 \delta_b t_b + E_a t_a^2 \delta_c t_c + E_b t_b^2 \delta_c t_c - \delta_a t_a^2 E_b t_c - \delta_b t_b^2 E_c t_c - \delta_a t_a^2 E_b t_b - \delta_a t_a E_b t_b^2 - \delta_a t_a E_c t_c^2 - \delta_b t_b E_c t_c^2 - 2\delta_a t_a t_b E_c t_c + 2 E_a t_a t_b \delta_c t_c = 0 \quad (1),$$

where $E_i$ (i=a, b, c) denotes a Young's modulus of each of the first sub-layer, the second sub-layer, and the second material layer, $t_i$ (i=a, b, c) denotes the thickness of each of the first sub-layer, the second sub-layer, and the second material layer, and $\delta_i$ (i=a, b, c) denotes the stress of each of the first sub-layer, the second sub-layer, and the second material layer.

In practice, generally a particular material layer may have a fixed thickness or the thicknesses of the respective film layers may have a particular relationship. In such a case, in conducting the stress matching according to the technology of the present disclosure, there may be a particular constraint condition among the thicknesses of the respective film layers. Hereinafter, some common cases are exemplified.

1. $t_c$ is a fixed value, and $(t_a+t_b)$ is also a fixed value

Assume $t_c=h_3$ and $t_b=h-t_a$, where $h_3$ and $h$ are constants. In this case, when the stress is matched, the thicknesses of the respective film layers can satisfy the following equation:

$$t_a = h - \frac{A+B}{C}, \quad (2)$$

where $$A = \sqrt{\begin{array}{l} E_a^2 \delta_a^2 E_b^2 h^4 + 4 E_a^2 \delta_a^2 E_b^2 h^3 h_3 + 4 E_a^2 \delta_a^2 E_b^2 h^2 h_3^2 + 2 E_a^2 \delta_a^2 E_b E_c h^2 h_3^2 + \\ 4 E_a^2 \delta_a^2 E_b E_c h h_3^3 + E_a^2 \delta_a^2 E_c^2 h_3^4 - 2 E_a^2 \delta_a E_b^2 \delta_b h^4 - 4 E_a^2 \delta_a E_b^2 \delta_b h^3 h_3 - \\ 2 E_a^2 \delta_a E_b \delta_b E_c h^2 h_3^2 + 2 E_a \delta_a E_b^2 \delta_b E_c h^2 h_3^2 + 4 E_a \delta_a E_b^2 \delta_b E_c h h_3^3 - \\ 4 E_a \delta_a E_b \delta_b E_c^2 h^2 h_3^2 - 8 E_a \delta_a E_b \delta_b E_c^2 h h_3^3 - 2 E_a \delta_a E_b \delta_b E_c^2 h_3^4 - \\ 4 E_a^2 \delta_a E_b E_c \delta_c h^3 h_3 - 10 E_a^2 \delta_a E_b E_c \delta_c h^2 h_3^2 - 4 E_a^2 \delta_a E_b E_c \delta_c h h_3^3 - \\ 4 E_a^2 \delta_a E_c^2 \delta_c h h_3^3 - 2 E_a^2 \delta_a E_c^2 \delta_c h_3^4 - 2 E_a \delta_a E_b^2 E_c \delta_c h^2 h_3^2 - \\ 4 E_a \delta_a E_b^2 E_c \delta_c h h_3^3 + 4 E_a \delta_a E_b E_c^2 \delta_c h^2 h_3^2 + 8 E_a \delta_a E_b E_c^2 \delta_c h h_3^3 + \\ 2 E_a \delta_a E_b E_c^2 \delta_c h_3^4 + E_a^2 E_b^2 \delta_b^2 h^4 - 2 E_a E_b^2 \delta_b^2 E_c h^2 h_3^2 + E_b^2 \delta_b^2 E_c^2 h_3^4 + \\ 4 E_a^2 E_b \delta_b E_c \delta_c h^3 h_3 + 2 E_a^2 E_b \delta_b E_c \delta_c h^2 h_3^2 + 2 E_a E_a^2 \delta_b E_c \delta_c h^2 h_3^2 + \\ 4 E_a E_b \delta_b E_c^2 \delta_c h^2 h_3^2 + 4 E_a E_b \delta_b E_c^2 \delta_c h h_3^3 + 2 E_a E_b \delta_b E_c^2 \delta_c h_3^4 - \\ 2 E_b^2 \delta_b E_c^2 \delta_c h_3^4 + 4 E_a^2 E_c^2 \delta_c^2 h^2 h_3^2 + 4 E_a^2 E_c^2 \delta_c^2 h h_3^3 + E_a^2 E_c^2 \delta_c^2 h_3^4 - \\ 4 E_a E_b E_c^2 \delta_c^2 h^2 h_3^2 - 4 E_a E_b E_c^2 \delta_c^2 h h_3^3 - 2 E_a E_b E_c^2 \delta_c^2 h_3^4 + E_b^2 E_c^2 \delta_c^2 h_3^4 \end{array}}$$

$$B = -E_a \delta_a E_b h^2 + E_a E_b \delta_b h^2 + E_a \delta_a E_c h_3^2 - E_b \delta_b E_c h_3^2 - E_a E_c \delta_c h_3^2 + E_b E_c \delta_c h_3^2 - 2 E_a \delta_a E_b h h_3 + 2 E_a \delta_a E_c h h_3,$$

and $$C = 2 E_a E_b \delta_b h - 2 E_a \delta_a E_b h - 4 E_a \delta_a E_b h_3 + 2 E_a \delta_a E_c h_3 + 2 E_b \delta_b E_c h_3 + 2 E_a E_c \delta_c h_3 - 2 E_b E_c \delta_c h_3;$$

and $$t_b = \frac{A+B}{C}. \quad (3)$$

2. $t_c$ is a fixed value

Assume $t_c=h_3$, where $h_3$ is a constant. In this case, when the stress is matched, $t_a$ and $t_b$ can satisfy the following equation:

$$t_b = \frac{D+E}{F}, \quad (4)$$

where

-continued $$D = \begin{pmatrix} E_a^2\delta_a^2 E_b^2 t_a^4 + 4E_a^2\delta_a^2 E_b^2 t_a^3 h_3 + 4E_a^2\delta_a^2 E_b^2 t_a^2 h_3^2 - 4E_a^2\delta_a^2 E_b E_c t_a^3 h_3 - \\ 4E_a^2\delta_a^2 E_b E_c t_a^2 h_3^2 - 2E_a^2\delta_a E_b \delta_b t_a^4 - 4E_a^2\delta_a E_b^2 \delta_b t_a^3 h_3 - \\ 4E_a^2\delta_a E_b \delta_b E_c t_a^3 h_3 + 4E_a^2\delta_a E_b \delta_b E_c t_a^2 h_3^2 + 2E_a^2\delta_a E_b^2 \delta_b E_c t_a^2 h_3^2 + \\ 4E_a^2\delta_a E_b^2 \delta_b E_c t_a h_3^3 - 4E_a\delta_a E_b \delta_b E_c^2 t_a^2 h_3^2 - 4E_a\delta_a E_b \delta_b E_c^2 t_a h_3^3 - \\ 4E_a\delta_a E_b E_c \delta_c t_a^2 h_3^2 - 2E_a\delta_a E_b^2 E_c \delta_c t_a^2 h_3^2 - 4E_a\delta_a E_b^2 E_c \delta_c t_a h_3^3 + \\ 4E_a\delta_a E_b E_c^2 \delta_c t_a^2 h_3^2 + 4E_a\delta_a E_b E_c^2 \delta_c t_a h_3^3 + E_a^2 E_b^2 \delta_b^2 t_a^4 - \\ 2E_a E_b^2 \delta_b^2 E_c t_a^2 h_3^2 + E_b^2 \delta_b^2 E_c^2 h_3^4 - 4E_a^2 E_b \delta_b E_c \delta_c t_a^2 h_3^2 + \\ 2E_a E_b^2 \delta_b E_c \delta_c t_a^2 h_3^2 + 4E_a E_b \delta_b E_c^2 \delta_c t_a^2 h_3^2 - 2E_b^2 \delta_b E_c^2 \delta_c h_3^4 + \\ 4E_a^2 E_c^2 \delta_c^2 t_a^2 h_3^2 - 4E_a E_b E_c^2 \delta_c^2 t_a^2 h_3^2 + E_b^2 E_c^2 \delta_c^2 h_3^4 \end{pmatrix}^{1/2}$$

$$E = -E_a \delta_a E_b t_a^2 + E_a E_b \delta_b t_a^2 - E_b \delta_b E_c h_3^2 + \\ E_b E_c \delta_c h_3^2 - 2E_a \delta_a E_b t_a h_3 + 2E_a E_c \delta_c t_a h_3,$$

and $$F = 2E_a \delta_a E_b t_a - 2E_a E_b \delta_b t_a + 2E_b \delta_b E_c h_3 - 2E_b E_c \delta_c h_3.$$

3. $(t_a + t_b)$ is a fixed value

Assume $t_a + t_b = h$, where h is a constant. In this case, when the stress is matched, $t_c$ and $t_a$ can satisfy the following equation:

$$t_c = \frac{G - H}{I}, \quad (5)$$

where $$G = \begin{matrix} 2E_a\delta_a E_b t_a^2 - E_a\delta_a E_c t_a^2 - E_b\delta_b E_c t_a^2 - E_a E_c\delta_c t_a^2 + E_b E_c\delta_c t_a^2 - \\ E_b\delta_b E_c h^2 + E_b E_c\delta_c h^2 - 2E_a\delta_a E_b h t_a + 2E_b\delta_b E_c h t_a + \\ 2E_a E_c\delta_c h t_a - 2E_b E_c\delta_c h t_a \end{matrix},$$

$H =$ $$\begin{pmatrix} 4E_a^2\delta_a^2 E_b^2 h^2 t_a^2 - 8E_a^2\delta_a^2 E_b^2 h t_a^3 + 4E_a^2\delta_a^2 E_b^2 t_a^4 - 4E_a^2\delta_a^2 E_b E_c h^2 t_a^2 + \\ 8E_a^2\delta_a^2 E_b E_c h t_a^3 - 4E_a^2\delta_a^2 E_b E_c t_a^4 + E_a^2\delta_a^2 E_c^2 t_a^4 + \\ 4E_a^2\delta_a E_b \delta_b E_c h^2 t_a^2 - 4E_a^2\delta_a E_b \delta_b E_c h t_a^3 - 4E_a\delta_a E_b^2 \delta_b E_c h^2 t_a^2 + \\ 8E_a\delta_a E_b^2 \delta_b E_c h t_a^3 - 4E_a\delta_a E_b^2 \delta_b E_c t_a^4 + 2E_a\delta_a E_b \delta_b E_c^2 h^2 t_a^2 - \\ 4E_a\delta_a E_b \delta_b E_c^2 h t_a^3 + 2E_a\delta_a E_b \delta_b E_c^2 t_a^4 - 4E_a\delta_a E_b E_c\delta_c h^2 t_a^2 + \\ 8E_a^2\delta_a E_b E_c\delta_c h t_a^3 - 4E_a\delta_a E_b E_c\delta_c t_a^4 - 4E_a\delta_a E_c^2\delta_c h t_a^3 + \\ 2E_a^2\delta_a E_c^2\delta_c t_a^4 + 4E_a\delta_a E_b^2 E_c\delta_c h^2 t_a^2 - 8E_a\delta_a E_b^2 E_c\delta_c h t_a^3 + \\ 4E_a\delta_a E_b^2 E_c\delta_c t_a^4 - 2E_a\delta_a E_b E_c^2\delta_c h^2 t_a^2 + 4E_a\delta_a E_b E_c^2\delta_c h t_a^3 - \\ 2E_a\delta_a E_b E_c^2\delta_c t_a^4 + 4E_a E_b^2\delta_b^2 E_c h^3 t_a - 8E_a E_b^2\delta_b^2 E_c h^2 t_a^2 + \\ 4E_a E_b^2\delta_b^2 E_c h t_a^3 + E_b^2\delta_b^2 E_c^2 h^4 - 4E_b^2\delta_b^2 E_c^2 h^3 t_a + \\ 6E_b^2\delta_b^2 E_c^2 h^2 t_a^2 - 4E_b^2\delta_b^2 E_c^2 h t_a^3 + E_b^2\delta_b^2 E_c^2 t_a^4 - \\ 4E_a^2\delta_b E_b E_c\delta_c h^2 t_a^2 + 4E_a^2 E_b\delta_b E_c\delta_c h t_a^3 - 4E_a E_b^2\delta_b E_c\delta_c h^3 t_a + \\ 8E_a E_b^2\delta_b E_c\delta_c h^2 t_a^2 - 4E_a E_b^2\delta_b E_c\delta_c h t_a^3 - 4E_b E_c^2\delta_c h^3 t_a + \\ 10E_a E_b\delta_b E_c^2\delta_c h^2 t_a^2 - 8E_a E_b\delta_b E_c^2\delta_c h t_a^3 + 2E_a E_b\delta_b E_c^2\delta_c t_a^4 - \\ 2E_b^2\delta_b E_c^2\delta_c h^4 + 8E_b^2\delta_b E_c^2\delta_c h^3 t_a - 12E_b^2\delta_b E_c^2\delta_c h^2 t_a^2 + \\ 8E_b^2\delta_b E_c^2\delta_c h t_a^3 - 2E_b^2\delta_b E_c^2\delta_c t_a^4 + 4E_a^2 E_c^2\delta_c^2 h^2 t_a^2 - \\ 4E_a^2 E_c^2\delta_c^2 h t_a^3 + E_a^2 E_c^2\delta_c^2 t_a^4 + 4E_a E_b E_c^2\delta_c^2 h^3 t_a - \\ 10E_a E_b E_c^2\delta_c^2 h^2 t_a^2 + 8E_a E_b E_c^2\delta_c^2 h t_a^3 - 2E_a E_b E_c^2\delta_c^2 t_a^4 + \\ E_b^2 E_c^2\delta_c^2 h^4 - 4E_b^2 E_c^2\delta_c^2 h^3 t_a + 6E_b^2 E_c^2\delta_c^2 h^2 t_a^2 - \\ 4E_b^2 E_c^2\delta_c^2 h t_a^3 + E_b^2 E_c^2\delta_c^2 t_a^4 \end{pmatrix}^{1/2}$$

and $$I = 2E_b\delta_b E_c h - 2E_b E_c\delta_c h + \\ 2E_a\delta_a E_c t_a - 2E_b\delta_b E_c t_a - 2E_a E_c\delta_c t_a + 2E_b E_c\delta_c t_a.$$

4. $t_a/t_b$ is a fixed value

Assume $t_a/t_b = h$, where h is a constant. In this case, when the stress is matched, $t_c$ and $t_a$ can satisfy the following equation:

$$t_c = \frac{J - K}{L}, \quad (6)$$

where $$J = t_a(E_a E_c\delta_c - E_a\delta_a E_c - \\ 2E_a\delta_a E_b h + 2E_a E_c\delta_c h - E_b\delta_b E_c h^2 + E_b E_c\delta_c h^2),$$

$$K = t_a \begin{pmatrix} 4E_a^2\delta_a^2 E_b^2 h^2 - 4E_a^2\delta_a^2 E_b E_c h^2 + E_a^2\delta_a^2 E_c^2 + 4E_a^2\delta_a E_b\delta_b E_c h^2 + \\ 4E_a^2\delta_a E_b\delta_b E_c h^2 - 4E_a E_b^2\delta_b E_c h^2 + 2E_a\delta_a E_b\delta_b E_c^2 h^2 - \\ 4E_a\delta_a E_b E_c\delta_c h^2 - 4E_a^2\delta_a E_c^2\delta_c h - 2E_a^2\delta_a E_c^2\delta_c + \\ 4E_a\delta_a E_b^2 E_c\delta_c h^2 - 2E_a\delta_a E_b E_c^2\delta_c h^2 + 4E_a E_b^2\delta_b^2 E_c h^3 + \\ 4E_a E_b^2\delta_b^2 E_c h^2 + E_b^2\delta_b^2 E_c^2 h^4 - 4E_a^2 E_b\delta_b E_c\delta_c h^2 - \\ 4E_a E_b\delta_b E_c\delta_c h - 4E_a E_b^2\delta_b E_c\delta_c h^3 - 4E_a E_b^2\delta_b E_c\delta_c h^3 - \\ 4E_a E_b^2\delta_b E_c\delta_c h^2 - 4E_a E_b\delta_b E_c^2\delta_c h^3 - 2E_a E_b\delta_b E_c^2\delta_c h^2 - \\ 2E_b^2\delta_b E_c^2\delta_c h^4 + 4E_a^2 E_c^2\delta_c^2 h^2 + 4E_a^2 E_c^2\delta_c^2 h + E_a^2 E_c^2\delta_c^2 + \\ 4E_a E_b E_c^2\delta_c^2 h^3 + 2E_a E_b E_c^2\delta_c^2 h^2 + E_b^2 E_c^2\delta_c^2 h^4 \end{pmatrix}^{1/2}$$

and $$L = 2\delta_a E_a E_c - 2\delta_c E_a E_c + 2\delta_b E_b E_c h - 2\delta_c E_b E_c h.$$

5. $t_c/(t_a + t_b)$ is a fixed value (for example, n), and $(t_a + t_b)$ is also a fixed value (for example, H)

In this case, the stress values $\delta_a$, $\delta_b$, and $\delta_c$ satisfy the following equations:

$$0 < t_a < H, \text{ and}$$

$$\begin{matrix} n^4\delta_a^2 E_c^2 + 4n^3 E_c^2\delta_a^2 + n^4 E_c^2\delta_b^2 + 4n^2 E_a^2\delta_c^2 + \\ 4n^3 E_a^2\delta_c^2 + 4n^2 E_c^2\delta_a^2 + n^4\delta_b^2 E_b^2 + n^4 E_a^2\delta_c^2 + \\ \delta_a^2 E_b^2 + E_a^2\delta_b^2 - 2n^2 E_c\delta_a E_a\delta_b - 8n^3 E_a\delta_a E_a\delta_c + \\ 2n^4 E_c\delta_a E_b\delta_b + 4n^3 E_c\delta_a E_b\delta_b - 2n^4 E_c\delta_a E_a\delta_c + \\ 2n^2 E_b\delta_b E_a\delta_b - 4n E_a\delta_a E_b\delta_c - 2n^2 E_a\delta_a E_b\delta_a + \\ 4n^2 E_a\delta_a E_c\delta_b + 4n^3 E_a\delta_a E_c\delta_b - 4n E_b\delta_b E_c\delta_a + \\ 2n^2 E_a\delta_a E_a\delta_b - 2n^4 E_b\delta_b E_b\delta_c + 2n^4 E_b\delta_b E_a\delta_c - \\ 8n^2 E_a\delta_a E_c\delta_a + 4n^2 E_a\delta_a E_b\delta_c + 2n^2 E_c\delta_a^2 E_b - \\ 4n^3 E_c^2\delta_a\delta_b - 2n^4 E_c^2\delta_a\delta_b - 2E_b\delta_a E_a\delta_b + 4n\delta_a^2 E_b E_c - \\ 2n^2 E_b^2\delta_a\delta_b - 4n^2 E_c^2\delta_a\delta_b - 2n^2 E_a E_c\delta_b^2 + \\ 4nE_a^2\delta_b\delta_c + 2n^2 E_a^2\delta_b\delta_c - 4n^2 E_a E_b\delta_c^2 - \\ 4n^2 E_a E_b\delta_c^2 - 2n^4 E_a E_b\delta_c^2 \geq 0 \end{matrix} \quad (7).$$

The thicknesses of the respective film layers can satisfy the following equation:

$$t_a = (M \pm N)H / 2O, \quad (8)$$

where $$M = -n^2 E_c\delta_a - \delta_a E_b + 2E_c n\delta_b + \delta_b E_a + n^2 E_c\delta_b + \\ 2nE_a\delta_c - 2E_c n\delta_a - n^2\delta_a E_b - 2n\delta_c E_b + n^2 E_a\delta_c,$$

-continued $$N = \sqrt{\begin{aligned}&n^4\delta_a^2 E_c^2 + 4n^3 E_c^2\delta_a^2 + n^4 E_c^2\delta_b^2 + 4n^2 E_n^2\delta_c^2 + 4n^3 E_a^2\delta_c^2 + \\&4n^2 E_c^2\delta_a^2 + n^4\delta_c^2 E_b^2 + n^4 E_a^2\delta_c^2 + \delta_a^2 E_b^2 + E_a^2\delta_b^2 - 2n^2 E_c\delta_a E_a\delta_b - \\&8n^3 E_c\delta_a E_a\delta_c + 2n^4 E_c\delta_a E_b\delta_c + 4n^3 E_c\delta_a E_b\delta_c - 2n^4 E_c\delta_a E_a\delta_c + \\&2n^2 E_c\delta_b\delta_a E_b - 4n E_a E_b\delta_a\delta_c - 2n^2 E_a\delta_c E_b\delta_a + 4n^2 E_a\delta_c E_c\delta_b + \\&4n^3 E_a\delta_c E_c\delta_b - 4n E_a\delta_b E_c\delta_a + 2n^2 E_a\delta_b E_b\delta_c - 2n^4 E_c\delta_b E_b\delta_c + \\&2n^4 E_c\delta_b E_a\delta_c - 8n^2 E_a\delta_c E_c\delta_a + 4n^2 E_c\delta_a E_b\delta_c + 2n^2 E_c\delta_a^2 E_b - \\&4n^3 E_c^2\delta_a\delta_b - 2n^4 E_c^2\delta_a\delta_b - 2 E_b\delta_a E_a\delta_b + 4n\delta_a^2 E_b E_c - \\&2n^2 E_b^2\delta_a\delta_c - 4n^2 E_c^2\delta_a\delta_b - 2n^2 E_a E_c\delta_b^2 + 4n E_a^2\delta_b\delta_c + \\&2n^2 E_a^2\delta_b\delta_c - 4n^3 E_a E_b\delta_c^2 - 4n^2 E_a E_b\delta_c^2 - 2n^4 E_a E_b\delta_c^2\end{aligned}}$$

and $$O = \delta_b E_a - \delta_a E_b - n\delta_a E_c + n\delta_c E_a + n\delta_b E_c - n\delta_c E_b.$$

According to embodiments of the present disclosure, the stress matching can be achieved in a simple way, and is compatible with conventional CMOS processes. The technology of the present disclosure can achieve the stress matching by means of the existing process menus, with no needs to perform complicated adjustments of process parameters or to newly develop process conditions, and thus impose less stringent requirements on film deposition apparatuses and processes.

The technology of the present disclosure has a variety of applications. Specifically, the technology is applicable to any bi/multi-material structures where stress matching is desirable. The materials generally comprise metal or non-metal materials such as $SiO_x$, $SiN_x$, poly-silicon, amorphous silicon, PSG, Al, Au, Ti, Cr, and Ni, and oxides or alloys of the metal materials, and the like. More specifically, the technology is especially suitable for stress matching in a double-material cantilever beam where one layer has compressive stress while the other layer has tensile stress, such as a bi-material beam of $SiO_x$/Al, $SiN_x$/Al, $SiO_x$/Au, or $SiN_x$/Au.

The technology of the present disclosure has a low cost and a short processing cycle, and is applicable to double-material films with any thicknesses or any thickness ratios. The stress matching can be achieved if the thicknesses and stress of the respective film layers satisfy the above relationships, with no needs to carry out a number of experiments for the purpose of stress matching. As a result, it is possible to reduce the cost and shorten the processing cycle.

The technology of the present disclosure is very suitable for device developments directly in FAB.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

We claim:

1. A method of manufacturing a cantilever beam structure where stress is matched, comprising:

depositing a first sub-layers having a first thickness of a first material with a first deposition menu;

depositing a second sub-layer of a second thickness of the first material with a second deposition menu different from the first deposition menu, wherein the first sub-layer and the second sub-layer are disposed adjacent to each other to form a first layer; and depositing a second layer of a third thickness of a second material different from the first material, wherein the first layer and the second layer are disposed adjacent to each other, wherein the method further comprises matching stress between the first layer and the second layer by adjusting at least one of the first thickness, the second thickness and the third thickness.

2. The method of claim 1, wherein the deposition menus each comprise a combination of a given deposition process and process parameters developed with respect to the given deposition process.

3. The method of claim 2, wherein the deposition process comprises any one or more of evaporation, sputtering, Plasma Enhanced Chemical Vapor Deposition (PECVD), Low Pressure Chemical Vapor Deposition (LPCVD), Atmospheric Pressure Chemical Vapor Deposition (APCVD), High Density Plasma Chemical Vapor Deposition (HDPCVD), Atom Layer Deposition (ALD), and Metal Organic Chemical Vapor Deposition (MOCVD).

4. The method of claim 1, wherein the second layer is deposited with one or more deposition menus.

5. The method of claim 1, wherein each of the first material and the second material comprises a non-metal material, a metal material or an oxide or alloy thereof, or a compound of a non-metal material and a metal material.

6. The method of claim 5, wherein the non-metal material comprises any one or more of silicon oxide, silicon nitride, silicon oxynitride, poly-silicon, amorphous silicon, glass, C, Ge, SiC, USG, polyimide, BCB, and photoresist, and the metal material comprises any one or more of Al, Au, Ti, Cr, Ag, Pt, Ni, Zn, Pb, W, Cu, Sn, In, and Ga.

7. The method of claim 1, wherein the first layer and the second layer are disposed on a substrate or a sacrificial layer, and the method further comprises:

patterning the first layer and the second layer to form a beam configuration; and selectively etching the substrate or the sacrificial layer to release the beam configuration so as to form the cantilever beam structure.

8. The method of claim 1, wherein the respective thicknesses of the first sub-layer, the second sub-layer, and the second layer and the stress thereof satisfies:

$$E_a t_a \delta_b t_b^2 + E_a t_a \delta_a t_c^2 + E_b t_b \delta_a t_c^2 + E_a t_a^2 \delta_b t_b + E_a t_a^2 \delta_a t_a + E_b t_b^2 \delta_a t_a - \delta_a t_a^2 E_c t_a - \delta_b t_b^2 E_c t_c - \delta_a t_a E_b t_b - \delta_a t_a E_b t_b - \delta_a t_a E_c t_c^2 - \delta_b t_b E_c t_c^2 - \delta_a t_a t_b E_c t_c + 2 E_a t_a t_b \delta_c t_c = 0,$$

where $E_i$ denotes a Young's modulus of each of the first sub-layer, the second sub-layer, and the second material layer when i=a, b, c, respectively, $t_i$ denotes the thickness of each of the first sub-layer, the second sub-layer, and the second material layer when i=a, b, c, respectively, and $\delta_i$ denotes the stress of each of the first sub-layer, the second sub-layer, and the second material layer when i=a, b, c, respectively.

9. The method of claim 2, wherein the deposition menus each are a standard option developed by a manufacturer.

10. The method of claim 1, further comprising:

depositing a third sub-layer of the first material with a third deposition menu different from the first and second deposition menus, wherein the third sub-layer is deposited adjacent to a stack of the first and second sub-layers to form the first layer.

11. The method of claim 1, wherein depositing the second layer comprises:
  depositing a first sub-layer of the second material with a third deposition menu; and
  depositing a second sub-layer of the second material with a fourth deposition menu different from the third deposition menu.

* * * * *